Figure 1:
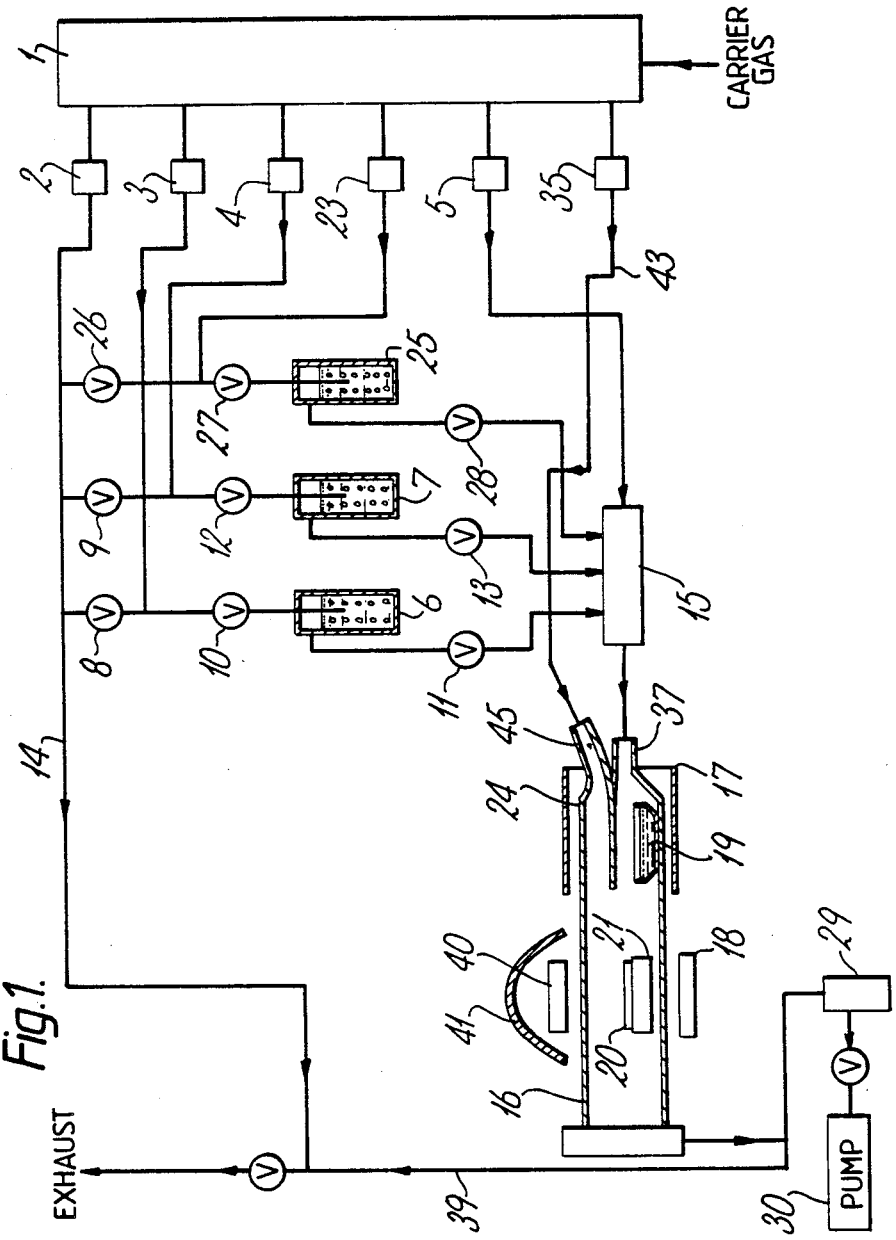

United States Patent [19]

Irvine et al.

[11] Patent Number: 4,950,621
[45] Date of Patent: Aug. 21, 1990

[54] METHOD OF GROWING CRYSTALLINE LAYERS BY VAPOUR PHASE EPITAXY

[75] Inventors: Stuart J. Irvine, Malvern; John B. Mullin, West Malvern; Jean Giess, Malvern, all of England

[73] Assignee: Secretary of the State for Defence in Her Majesty's Government of the United Kingdom of Great Britain and Northern Ireland, United Kingdom

[21] Appl. No.: 795,447

[22] Filed: Nov. 6, 1985

[30] Foreign Application Priority Data

Nov. 6, 1984 [GB] United Kingdom ................. 8428032

[51] Int. Cl.$^5$ ..................... H01L 21/20; H01L 21/26
[52] U.S. Cl. ............................ 437/81; 148/DIG. 48; 148/DIG. 64; 148/DIG. 94; 156/613; 437/173; 437/87; 437/936; 437/949; 437/963
[58] Field of Search ............. 29/576 E; 148/1.5, 33.4, 148/175, DIG. 64, 94, 65, 110, 48; 156/613, 614, 610, 650; 427/42, 54.1, 55, 76, 87; 437/19, 81, 82, 87, 107, 173, 708, 936, 939, 946, 949, 963

[56] References Cited

U.S. PATENT DOCUMENTS

| | | | |
|---|---|---|---|
| 3,200,018 | 8/1965 | Grossman | 148/175 |
| 4,062,706 | 12/1977 | Ruehrwein | 148/175 |
| 4,115,163 | 9/1978 | Gorina et al. | 148/175 |
| 4,439,267 | 3/1984 | Jackson, Jr. | 156/614 |
| 4,447,469 | 5/1984 | Peters | 427/54.1 |
| 4,454,835 | 6/1984 | Walsh | 118/712 |
| 4,509,997 | 4/1985 | Cockayne et al. | 148/175 |
| 4,524,090 | 6/1985 | Bottka et al. | 427/53.1 |
| 4,566,918 | 1/1986 | Irvine et al. | 148/175 |
| 4,568,397 | 2/1986 | Hoke et al. | 156/614 |
| 4,645,687 | 2/1987 | Donnelly et al. | 427/53.1 |
| 4,645,689 | 2/1987 | Cox | 427/87 |

FOREIGN PATENT DOCUMENTS

| | | |
|---|---|---|
| 0038734 | 9/1984 | Japan. |
| 59-164697 | 9/1984 | Japan. |
| WO84/00178 | 1/1984 | PCT Int'l Appl. |

OTHER PUBLICATIONS

Johnson et al., "Photodeposition of Zn, Se and ZnSe Thin Films", Appl. Phys. Lett., 40(9), May 1, 1982, pp. 798-800.

Frolov et al., "Stimulation of Gaseous Growth of Epitaxial Layer of GaAs", Inorg. Mater., 13(5), 1977, pp. 743-744.

Irvine et al., "A Study . . . Photolysis of Some Group II and Group VI Alkyls", J. Electrochem. Soc., vol. 132, No. 4, Apr. 1985, pp. 968-972.

Paul Vohl and Charles M. Wolfe, "Vapor Phase Growth of $Hg_{1-x}Cd_xTe$ Epitaxial Layers", Journal of Electronic Materials, vol. 7, No. 5, pp. 659-677 (1978).

W. E. Hoke and P. J. Lemonias, Appl. Phys. Lett., vol. 46, No. 4, pp. 398-400, Feb. 15, 1985.

P. J. Young, G. Greig and O. P. Strausz, "Flash Photosensitizations by Cadmium and Zinc Atoms", J. Am. Chem. Soc., 92, pp. 413-415, (1970).

(List continued on next page.)

Primary Examiner—Olik Chaudhuri
Assistant Examiner—William Bunch
Attorney, Agent, or Firm—Cushman, Darby & Cushman

[57] ABSTRACT

A method of growing an epitaxial crystalline layer on a substrate which comprises the steps of (a) providing in the reaction zone of a reaction vessel a heated substrate (b) establishing a gas stream, provided by a carrier gas which gas stream comprises at least 50% by volume of a gas which suppresses the homogeneous nucleation of particles in the vapor phase which contains, in the vapor phase, at least one alkyl of an element selected from Group 15 and Group 16 of the Periodic Table, (c) passing the gas stream through the reaction zone into contact with the heated substrate, and (d) irradiating at least a major part of the surface of the substrate with electromagnetic radiation to provide photolytic decomposition of the at least one alkyl and consequential epitaxial deposition of the layer containing the said element across at least a major part of the surface of the substrate.

29 Claims, 1 Drawing Sheet

OTHER PUBLICATIONS

J. Connor, G. Greig and O. P. Strausz, "The Reactions of Tellurium Atoms", J. Am. Chem. Soc. 91, pp. 5695–5696, (1969).

Irvine et al., "A Study of Transport and Pyrolysis in the Growth of $Cd_xHg_{1-x}Te$ by MOVPE", J. Cryst. Growth, 65 (1983), pp. 479–484.

Irvine et al., "Photosensitisation . . . Growth of Epitaxial HgTe", J. Cryst. Growth, 68(1984), pp. 188–193.

Irvine et al., "The Growth of Highly Uniform Cadmium Mercury Telluride by A New MOVPE Technique", Mat. Letters, 2(1984), May, No. 4B, pp. 305–307.

Patent Abstracts of Japan, vol. 9, No. 17 (C-262) (1740), Jan. 24, 1985 and JP, A, 59164697 (Sumitomo Denki Kogyo K.K.) Sep. 17, 1984.

Irvine et al., "Photosensitisation: A Stimulant for the Low Temperature Growth of Epitaxial HgTe", Journal of Crystal Growth, vol. 68, pp. 188–193, 1984.

Donnelly et al., "Excimer Laser-Induced Deposition of InP: Crystallographic and Mechanistic Studies", J. Appl. Phys. 58(5):2022–35 (1985).

METHOD OF GROWING CRYSTALLINE LAYERS BY VAPOUR PHASE EPITAXY

This invention relates to a method of growing crystalline layers by vapour phase epitaxy. The invention in particular relates to the growth of epitaxial layers of cadmium mercury telluride.

The growth of metal and semiconductor layers on a substrate by the method of vapour phase epitaxy is well known in the crystal growing art. The method offers the possibility of producing high purity monocrystalline layers at temperatures considerably lower than those used in other methods, e.g. growth by pulling from the melt.

The use of lower temperatures is in many cases desirable as it allows growth problems causing lack of homogeneity and purity of the product to be reduced or eliminated. For instance, in the case of the semiconductor material cadmium mercury telluride, the most promising narrow band gap material for infra-red photon detection, problems such as the high volatility of mercury, the high interdiffusion coefficient of Hg and Cd and the fast dopant diffusion and large segregation coefficients from the melt are present.

In view of these problems vapour phase epitaxy appears to be the only practical method of producing crystalline layers of this material having the required composition and purity for advanced devices.

It is known to deposit epitaxial crystalline layers on substrates by the pyrolytic decomposition of organic compounds containing the elements required to form the layers. Such methods are described in, for example, UK Patent Application No. GB-2078695A and U.S. Pat. No. 4,439,267. Although the growth temperatures, i.e. the decomposition temperatures of the organic compounds used, are lower than in growth from the melt techniques they could preferably be further reduced. For instance the typical temperature of 410° C. used in the expitaxial growth of cadmium mercury telluride in the method described in the above mentioned specification could usefully be reduced to 300° C. or less to provide even better controlled expitaxial layers. Unfortunately, the pyrolytic decomposition of the organic compounds used cannot be effected at temperatures significantly below 400° C.

A further is epitaxial growth temperature may be obtained by the technique of photosensitisation or photodecomposition (photolytic decomposition). Essentially, electromagnetic radiation is used to assist the applied heat in providing decomposition of the vapour transported phase chemicals. For instance we have recently reported the growth of epitaxial mercury telluride layers by the photodecomposition of diethyl telluride in the presence of mercury vapour using ultra violet radiation (Journal of Crystal Growth, 68 (1984) 188–193). However, we have found that the carrier gas used to transport the vapours by this technique can have a significant effect on the product.

Where organic compounds are to be decomposed by the action of applied energy it appears at first sight desirable to use hydrogen as the carrier gas. This is basically because hydrocarbons are usually formed as waste products from the organic radicals present and hydrogen assists the formation of hydrocarbons avoiding carbon deposition. Hydrogen also has other desirable properties, e.g. a relatively high thermal conductivity. Indeed, hydrogen has most often been employed as a carrier gas in previously published methods of epitaxial deposition involving the decomposition of metal-organic compounds, e.g. alkyls, particularly in the decompsoition of alkyls to form cadmium mercury telluride.

However, we have found that when the decomposition of metal-organic compounds is carried out photolytically the use of a carrier gas composed entirely of hydrogen can unexpectedly be detrimental to the photodeposition process. For instance, when we attempted to grow cadmium telluride epitaxially by the photodecomposition of dimethyl cadmium and diethyl telluride using a wide range of dimethyl cadmium concentrations, the product was a dust having no practical use. The probable cause of this is a strong vapour phase photolytic reaction assisted by hydrogen which results in the homogeneous nucleation of CdTe particles.

It is an object of the present invention to provide a method whereby the above disadvantage of epitaxial growth employing electromagnetic radiation is overcome or at least mitigated in part.

According to the present invention there is provided a method of growing an epitaxial crystalline layer on a substrate which comprises the steps of (a) providing in the reaction zone of a reaction vessel a heated substrate (b) establishing a gas stream, provided by a carrier gas which comprises at least 50% by volume of an inert gas, which gas stream contains, in the vapour phase, at least one alkyl of an element selected from Group Vb and Group VIb of the Periodic Table, (c) passing the gas stream through the reaction zone into contact with the heated substrate, and (d) irradiating at least a major part of the surface of the substrate with electromagnetic radiation to provide photolytic decomposition of the at least one alkyl and consequential epitaxial deposition of the layer containing the said element across at least a major part of the surface of the substrate.

The reaction on the surface of the substrate may be controlled in a known way, for example by careful control of substrate temperature and of the flowrate and concentration of the gas stream through the reaction zone. However, in order to promote surface reaction it is also important that radiation reaches the substrate surface through the gas stream. Ultra-violet (uv) light, for example from a low, medium, or high pressure mercury lamp, is a generally suitable form of radiation, especially relatively long-wave uv radiation in the wavelength range 240 to 270 nm since shorter wavelength uv radiation (e.g., 200 nm or below) may tend to promote too great a degree of vapour phase decomposition of the at least one alkyl and so promote vapour phase nucleation of particles. Care must be taken to ensure that the wavelength of the uv radiation is not entirely resonant with the components in the gas stream, otherwise the stream may be entirely opaque to the radiation and none may reach the substrate. This problem is generally overcome by employing broad band uv radiation from, for example, a medium or high pressure Hg lamp.

The inert gas is conveniently selected from the group consisting of $N_2$, $CH_4$, $C_2$, $H_6$, He, Ne, Ar and mixtures thereof. The purpose of the inert gas is to suppress homogenous nucleation of particles in the vapour phase. The carrier gas preferably comprises more than 80%, most preferably more than 95%, by volume of inert gas. The carrier gas may contain small amounts, preferably less than 5% by volume, most preferably less than 1% by volume, of a reactive gas such as hydrogen. Preferably, the inert gas consists of helium.

By using a carrier gas comprising mainly or wholly an inert gas such as helium the problems caused by using a carrier gas consisting entirely of hydrogen may be avoided. Furthermore, the decomposition reaction may surprisingly proceed without carbon deposition. It is to be noted that by replacing hydrogen wholly or almost wholly by helium, no significant loss of thermal conductivity is caused since the thermal conductivities of these two gases are very similar, Helium is also much preferred as the inert gas because heavier inert gases such as $N_2$ and Ar will tend to produce strong convection currents in the reaction zone as the gas stream passes the heated substrate, which can upset the even growth of an expitaxial layer.

Preferably, the gas stream is passed over the substrate, the substrate being irradiated through the gas stream from above. A further flow of gas, free of organic reagents, may be provided through the reaction zone co-directionally with the gas stream between the source of radiation, preferably uv radiation, and the gas stream in order to prevent opaque products of photolytic decomposition from depositing between radiation source and the substrate. A build-up of opaque deposits would rapidly bring the growth of an expitaxial layer to a halt. The composition of this further flow is conveniently the same as that of the carrier gas. Preferably, the average velocity of this further flow fo gas is between 50% and 200% that of the gas stream as the two streams pass the substrate, and most preferably the average velocities of these two streams are substantially the same. The present inventors have found that by employing gas streams having similar velocities, mixing between the streams is kept to a minimum and expitaxial growth can continue for several hours if required without undue impairment of radiation intensity which might otherwise result from a buildup of opaque decomposition products over the radiation source.

It is preferable to maintain the total pressure of the gases passing through the reaction zone above 0.1 atmospheres in order to suppress premature alkane formation from the decomposition of the at least one alkyl. Such formation of alkanes is favoured by low pressures in the presence of electromagnetic, especially uv, radiation, and will enhance the concentration of free atoms in the reaction zone thus enhancing unwanted vapour phase homogenous nucleation of particles. A pressure in excess of 0.1 atmospheres also facilitates the use of relatively high partial pressures reactants in the reaction zone which are often desirable to promote epitaxial growth. The pressure is most preferably between 0.5 and 1.0 atmosphere absolute. Pressures above 1 atomsphere are undesirable because of potential leakage of toxic gases from the crystal growth equipment.

The epitaxial layer grown by the method of the present invention is preferably a IIb-VIb binary compound such as CdTe, a IIb-IIb-VIb ternary alloy such as CdHgTe, a IIIb-Vb binary compound such as GaAs, or a IIIb-IIIb-Vb ternary alloy such as GaAlAs. The gas stream therefore preferably contains, in the vapour phase, either (a) at least one alkyl of a Group Vb element and at least one alkyl of a Group IIIb element, or
(b) at least one alkyl of a Group VIb element and at least one alkyl of a Group IIb element The group IIb, IIIb, Vb and VIb elements are preferably selected from Cd, Zn, Hg, In, Ga, Al, P, As, Sb, S, Se and Te. The alkyls of these elements preferably contain simple alkyl or substituted alkyl groups having from 1 to 5 carbon atoms, and most preferably contain ethyl or methyl groups. Where an alkyl contains a plurality of alkyl radicals these radicals are preferably the same.

The present method is particularly advantageous when employing a Group Vb or Group VIb having a thermal decomposition temperature of more than 350° C. since it is the use of this category of alkyl that necessitates the undesirable use of high substrate temperatures in previous, known vapour phase epitaxy methods.

The substrate may be any suitable material and is preferably a semi-conductor material. The temperature to which the substrate is heated is not critical since the decomposition of the alkyl or alkyls in the reaction zone is achieved mainly photolytically and not thermally. However, some heating is desirable in order to assist alkyl decomposition and epitaxial growth, and in order to drive off from the surface of the substrate any organic or organo-metallic by-products which might otherwise contaminate the epitaxial layer. The optimum temperature of the substrate may be 100°-200° C. below the temperature which would otherwise be required in the absence of applied radiation to provide thermal decomposition. The advantages of being able to use a lower temperature are considerable. Firstly, it further reduces the risk of epitaxial layer contamination, and so can result in a product of higher purity. Secondly, a lower temperature of growth will result in a lower level of undesirable interdiffusion between two or more disimilar layers where a multi-layered product is required. Thirdly, where a layer of graded composition is required between two disimilar layers a closer control of graded layer composition can be achieved because interdiffusion is reduced.

According to an important aspect of the present invention there is provided a method of growing an epitaxial crystalline layer of a tellurium compound of formula $Cd_xHg_{1-x}Te$ where x is from 0 to 1 onto a substrate comprising the steps of (a) providing in the reaction zone of a reaction vessel a heated substrate
(b) establishing a gas stream, provided by a carrier gas which comprises at least 50% volume of an inert gas which gas stream contains in the vapour phase a volatile tellurium alkyl and, when x is greater than 0, a volatile cadmium alkyl,
(c) passing the gas stream through the reaction zone into contact with the substrate,
(d) when x is less than 1, providing an atmosphere of mercury at a required temperature and pressure in the reaction zone, and
(e) irradiating at least a major part of the surface of the substrate with electromagnetic radiation to provide photolytic decomposition of the alkyl compound or compounds in the region of the substrate and consequential expitaxial deposition of the tellurium compound across at least a major part of the surface of the substrate.

Ultra-violet (uv) radiation is generally preferred as the electromagnetic radiation, especially relatively long-wave uv radiation, in the wavelength range 240 270 nm since shorter wavelength uv radiation (e.g. 200 nm or below) may tend to promote too great a degree of vapour phase decomposition of the tellurium and (when x is greater than 0) cadmium alkyls and so promote vapour phase nucleation of telluride compound particles. A mercury arc lamp located outside the vessel is a convenient source of uv radiation. Preferably, a reflector is located behind the lamp in order to focus radiation into the vessel. Care must be taken to ensure that the wavelengths of the radiation is not entirely resonant with the components in the gas stream, otherwise the stream may be entirely opaque to uv radiation and none may reach the substrate. Where mercury vapour is present in the stream, the use of a low pressure Hg lamp emitting uv light at a single 253.7 nm wavelength should be avoided, and a broad band source, e.g. a high pressure Hg lamp, or a line source emitting uv radiation at a wavelength other than 253.7 nm, used instead.

The atmosphere of Hg, which is required when x is less than 1 is preferably provided in part or whole by a supply of mercury vapour introduced into the reaction zone. The supply of mercury vapour may be provided in a known way, by for example passing the gas stream over liquid mercury heated to a required temperature. The atmosphere of Hg may additionally or alternatively be provided by a photolytically unstable mercury compound such as dimethyl mercury which will readily decompose in the presence of electromagnetic, especially uv, radiation. The partial pressure of the mercury atmosphere in the reaction zone is preferably greater than $10^{-2}$ atmosphere, most preferably greater than $2 \times 10^{-2}$ atmospheres since if a lower partial pressure is used little or no mercury is found to be incorporated into growing epitaxial layer, and, when x is 0, virtually no growth occurs. For this reason the atmosphere of mercury is preferably provided in part or whole by a supply of mercury vapour because a photolytically decomposed mercury compound is unlikely on its own to be able to provide the required concentration of mercury.

Where the mercury atmosphere provided by a source of liquid mercury, an equilibrium partial pressure of $10^{-2}$ atmospheres may be obtained by heating the mercury source to at least 180° C., though in practice a temperature of above 200° C. is preferred. An excess of mercury vapour is not detrimental to the growth of the layer since its rate of growth is determined to a far greater extent by the concentration of cadmium or tellurium in the gas stream. The substrate is ideally maintained at a temperature above that of the mercury source in order to prevent the possibility of mercury vapour condensing on the substrate.

The reaction on the surface of the substrate may be controlled in a known way, by for example careful control of the flowrate of and reactant concentrations in the gas stream passing through the reaction zone. Unlike previous known methods of vapour phase epitaxy, however, it has been found that when x is greater than 0 the concentration of cadmium alkyl in the gas stream is critical and must surprisingly be maintained at very low levels otherwise the reactants produce only a dust and no epitaxial layer is formed. For this reason the volumetric ratio of carrier gas to cadmium alkyl is preferably greater than $10^4:1$, and is most preferably greater than $10^5:1$. The value of x when depositing a layer of cadmium mercury telluride is controlled by the ratio of cadmium alkyl to tellurium alkyl concentrations in the gas stream.

It has been found particularly advantageous to provide in the gas stream an additional photolytically unstable alkyl compound, in the vapour phase, whose products of decomposition do not contaminate the growing epitaxial layer. This additional alkyl compound provides an additional source of free alkyl radicals in the presence of the radiation in the reaction zone which tend to recombine with the tellurium and cadmium atoms (when present) liberated by photolytic decomposition from their respective alkyl molecules. The inventors have found that this effect tends not only to further supress vapour phase homogenous nucleation of particles, but also to increase the area of epitaxial growth. As an example, where x is <1 and the atmosphere of Hg is provided by a supply of Hg vapour, the additional alkyl compound may be a mercury alkyl, especially dimethyl mercury. Where $x=1$, a mercury may still be used provided its concentration in the gas stream is sufficiently low to prevent the Hg it liberates during photolysis from reacting with tellurium. As a further example, the additional alkyl compound may be an azoalkane, especially azomethane ($CH_3N_2CH_3$) or azoethane ($C_2H_5N_2C_2H_5$), since they are known to decompose photolytically to yield alkyl radicals and $N_2$, and $N_2$ is of course entirely compatible with the inert nature of the gas stream.

It is preferable to maintain the total pressure of the gases passing through the reaction zone above 0.1 atmosphere in order to suppress premature alkane formation from the decomposition of the tellurium and (when x is greater than 0) cadmium alkyls. Such formation of alkanes is favoured by low pressures in the presence of electromagnetic, especially uv, radiation, and will enhance the concentration of free tellurium and (when x is greater than 0) cadmium atoms in the reaction zone thus enhancing unwanted vapour phase homogeneous nucleation of telluride particles. A pressure in excess of 0.1 atmospheres also facilitates the use of relatively high partial pressure of reactants in the reaction zone which are often desirable to promote epitaxial growth. The pressure is preferably between 0.5 and 1.0 atmospheres absolute. Pressures above 1 atmosphere are undesirable because of potential leakage of toxic gases.

For the growth of epitaxial cadmium mercury telluride the method of the present invention is preferably carried out as follows. Mercury is provided in the form of mercury vapour from a heated mercury source inside the reaction vessel. Cadmium is obtained from a suitable cadmium alkyl and tellurium from a suitable tellurium alkyl. Thus a flow of evaporated cadmium and telluride alkyls in the gas stream, provided by the carrier gas comprising preferably pure helium, is passed over the mercury source carrying mercury vapour in the stream to the reaction zone. The substrate may be of cadmium telluride, other IIb-VIb material including mixed semiconductors, indium antimonide, silicon, germanium, gallium arsenide, spinel, alumina, sapphire or any other known substrate material. The substrate is preferably prepared and orientated, in a known way, e.g. in (100) orientation for CdHgTe deposition.

The epitaxial deposition of cadmium mercury telluride in the way described is an improved form of the general process described in UK published Patent Specification No. GB 2078695A.

Where cadmium mercury telluride is grown by the method of the present invention in a horizontal reaction vessel with the gas stream passed horizontally over a mercury source, preferably an inert gas is passed horizontally over the inner surface of the upper vessel wall to keep the wall beneath the ultra violet lamp free from deposits. Preferably this inert gas is helium. It may be introduced via an inlet port which extends over the mercury source. For the growth of cadmium mercury telluride by the method of the present invention the substrate is preferably heated by conduction from a susceptor, e.g. of graphite, which can be heated by an infrared lamp located outside the reaction vessel. The substrate surface on which the epitaxial growth occurs is preferably maintained at a temperature in the range 200°–350° C., most preferably 220°–270° C. Preferably, the radiation used to irradiate the gas stream in the reaction zone adjacents to the substrate is obtained from a broad band high pressure mercury arc lamp.

The grown layer may be a single epitaxial layer or multiple layers. Such a layer or layers may be graded in composition.

For example two $Cd_xHg_{1-x}Te$ layers may be grown with two different values of x so that a detector, sensitive to both the 3 to 5 and 8 to 14 micron wavebands may be made. Also a passivating layer of CdTe may be grown on the $Cd_xHg_{1-x}Te$ layer. Suitable IIb-VIb compounds or mixed alloys may be grown on the layer e.g. CdTe, ZnS, $CdTe_xSe_{1-x}$ which may be used to make heterojunctions or form anti-reflection coatings, etc.

The volatile cadmium alkyl may be dimethyl cadmium, diethyl cadmium, or dipropyl cadmium, etc, but is preferably dimethyl cadmium.

The volatile tellurium alkyl may be an alkyl such as diethyl telluride, dimethyl telluride, dipropyl telluride, or dibutyl telluride, etc, or equivalent hydrogen substituted tellurium alkyls, such as hydrogen ethyltelluride $[H(C_2H_5)Te]$. The alkyl is preferably diethyl telluride.

The layer or layers produced may be suitably doped by employing a volatile dopant in the gas stream which is photodecomposed together with the cadmium and tellurium alkyl. The partial pressure of the dopant in the gas stream will generally not exceed $10^{-4}$ torr(mm of Hg). Examples of dopants are $(CH_3)_3Al$, $(CH_3)_3Ga$ and $(CH_3)_3As$.

For the preparation by the method of the invention of an epitaxial layer of cadmium mercury telluride using a gas stream of dimethyl cadmium, diethyl telluride and mercury vapour carried by a carirer gas of helium the flow rate (speed) of the gas stream in the reaction zone is preferably in the range 0.5 cm sec$^{-1}$ to 100 cm sec$^{-1}$. A typical flow rate using a 6 cm diameter reaction vessel is 10 cm sec$^{-1}$.

The mercury vapour in the gas stream is preferably at a pressure of $10^{-2}$ atm, typically $4\times10^{-2}$ atmospheres, as determined by the temperature of the mercury source, e.g. preferably a temperature in the range 200° C.–350° C., most preferably 220° C.–270° C. The mercury may be heated by a resistance heater outside the reaction vessel. The relative proportions of dimethyl cadmium: diethyl telluride in the gas stream determine the composition of the grown expitaxial layer and may be adjusted accordingly.

As the photodecomposition of dimethyl cadmium is much more efficient than that of diethyl telluride, the concentration of dimethyl cadmium in the gas stream is preferably much less than that of diethyl telluride. Preferably, the relative proportions by volume are y parts of dimethyl cadmium to $(1-y)$ parts of diethyl telluride, where y is in the range 0.001 to 0.1, especially 0.005 to 0.05, e.g., typically 0.01.

The gas stream may be formed by passing purified helium carrier gas through two bubblers arranged in parallel containing the appropriate organic reagents, e.g. dimethyl cadmium and diethyl telluride suitably purified.

The content of dimethyl cadmium in the gas stream may be varied by the method described in published UK patent application GB-214 6663A, to provide alternate layers of CdTe and HgTe which readily diffuse into one another to provide a mixed IIb-VIb epitaxial structure. This is made possible because layers of both HgTe and CdTe may be grown by the present method. The composition of the mixed structure may be determined by the relative size of the layers as described in GB-2146663A. According to a further aspect of the present invention, therefore, there is provided a method of growing an epitaxial layer of the ternary alloy $Cd_xHg_{1-x}Te$ onto a substrate comprising the steps of providing an atmosphere of mercury vapour at a required temperature and pressure inside a vessel; controlling the temperature of the substrate independently of the vessel temperature; providing separate supplies of a cadmium alkyl, a tellurium alkyl, and a dilutant gas into the vessel to grow a layer of HgTe $t_1$ thick and a layer of CdTe $t_2$ thick in either order; switching the supply of cadmium alkyl to the substrate on and off to grow a layer of CdTe and of HgTe, the combined thickness $t_1+t_2$ of the two layers being not greater than 0.5 μm thick, the arrangement being such that the Cd alkyl decomposes preferentially with the Te alkyl in the region of the substrate to form CdTe as a layer on the substrate, the Te alkyl combines with the Hg vapour to form a HgTe layer on the substrate, the thickness of both layers allowing diffusion during growth to give an epitaxial layer of $Cd_xHg_{1-x}Te$ where $0<x<1$, wherein the cadmium and tellurium alkyls are each supplied to the vessel in the vapour phase within a carrier gas comprising at least 50% by volume of an inert gas, and further wherein at least a major part of the surface of the substrate is irradiated with electromagnetic radiation during the growth of the CdTe and HgTe layers. The radiation is preferably uv radiation.

An embodiment of the present invention will now be described by way of example with reference to the accompanying drawing, FIG. 1, which is a schematic flow diagram of apparatus for providing epitaxial growth on a substrate by chemical vapour photodeposition.

As shown in FIG. 1 high purity helium carrier gas supplied to a manifold 1 which maintains a supply for six mass flow controllers 2, 3, 4, 5, 23 and 35. Mass flow controller 2 supplies helium to a bypass line 14 connected to an exhaust line 39. Mass flow controllers 3 and 4 supply helium to alkyl bubblers 6 and 7, which respectively contain an alkyl of cadmium such as dimethyl cadmium and an alkyl of tellurium such as diethyl telluride. Helium flow from the controllers 3 and 4 can be diverted via bypass valves 8 and 9 to the bypass line 14 or through isolation valves 10, 11 and 12, 13 thus enabling the alkyl flows to be turned on and off. Helium bubbling through the liquid alkyl will become saturated with alkyl vapours at the ambient temperature of the liquid alkyls, typically 25° C. These alkyl plus helium streams are mixed in a mixer 15 with a further dilution flow of helium supplied by the mass flow controller 5. By control of flows through controllers 3, 4 and 5 the concentrations of cadmium and tellurium alkyls in the mixed gas stream can be independently determined, over a wide range of values.

The gas stream of helium plus alkyls leaving the mixer 15 is passed into a lower inlet port 37 of a silica glass reactor vessel 16. The part of the vessel 16 nearer the inlet port 37 is heated by an electrical resistance furnace 17. A mercury bath 19 inside the vessel 16 is heated by the furnace 17.

In a reaction zone further along the vessel 16 away from the inlet port 37 a carbon susceptor 21 carries a substrate 20 to be coated with an epitaxial layer of $Cd_xHg_{1-x}Te$. An infrared lamp 18 is located outside the vessel 16 and radiantly heats the susceptor 21 to heat the substrate 20.

A mercury lamp 40 located above the substrate 20 provides broad band ultra violet radiation which is focussed by a reflector 41 into the reaction zone adjacent to the upper surface of the substrate 20.

The exhaust vapour stream is extracted via the line 39.

A vacuum pump 30 is connected to the vessel 16 via a cold trap 29 for initial purging of the vessel 16.

The layer of $Cd_xHg_{1-x}Te$ grown on the substrate may include one or more dopants. Such a dopant is provided by passing helium from the manifold 1 through a mass flow controller 23 to a bubbler 25 containing an alkyl of the dopant. From the bubbler 25 the alkyl passes to the mixer 15 and thence to the vessel 16. Isolation valves 27 and 28 and bypass valve 26 control the flow of helium and the dopant alkyl.

Examples of dopants are Al, Ga, As, and P which may be produced from respective alkyls, for example Al from $(CH_3)_3Al$; Ga from $(CH_3)_3Ga$; As from $(CH_3)_3As$; and P from $(CH_3)_3P$.

The bubbler 25 may contain a mercury alkyl such as dimethyl mercury instead. In this case, the mercury alkyl is introduced into the vessel 16 in the same manner as the dopant.

A supply of helium via a line 43 controlled by the controller 35 is provided to a second inlet port 45 to the vessel 16, the inlet port 45 extending over the mercury bath 19. The lower part of the inlet port 45 over the mercury bath 19 is provided by a horizontal separator extending across the furnace 16. This supply of helium keeps the upper wall of the vessel above the substrate 20 free from deposits during the photodeposition process.

Mercury vapour from the bath 19 is carried by the stream of gases introduced at the inlet port 37, i.e. helium plus alkyls of cadmium and tellurium, over the substrate 20 which is heated preferably to a temperature of about 240°–250° C. (The temperature of the substrate 20 and of the mercury bath 19 may be monitored by a thermocouple not shown). Here, photosensitisation of the surface of the substrate 20 occurs, which together with the heating of the substrate 20 and absorption in the metal-organics of the applied radiation, provides decomposition of the alkyls. Deposition of cadmium mercury telluride plus any dopants included occurs as a monocrystalline epitaxial layer on the upper surface of the substrate 20.

Typical conditions for growth of a layer of $Cd_xHg_{1-x}Te$ on a CdTe substrate are:

alkyl bubbler temperature 25° C.; mercury bath temperature 230° C.; substrate temperature 240°–250° C.; gas flow speed 10 cm sec$^{-1}$ where the vessel 16 has a diameter of 6 cm; concentration of dimethyl cadmium (by volume)=1% of the concentration of diethyl telluride in the gas flow.

High purity layers of cadmium mercury telluride having various cadmium mole fractions x have been grown by the above described process example.

Specific examples of methods of growing epitaxial layers in accordance with the present invention using the apparatus illustrated in FIG. 1 will now be described with reference to the Figure and the above description. The internal diameter of the furnace 16 used was 6 cm, with the horizontal separator forming the lower part of the inlet port 45 above the mercury bath 19 being situated 4.5 cm from the bottom of the inside of the furnace. In all Examples, cadmium telluride CdTe was used as the substrate 20, and the content of the bubblers 6, 7 and 25 were dimethyl cadmium, diethyl telluride, and dimethyl mercury respectively. The temperature of each bubbler was maintained at 25° C. unelss otherwise stated. The bubblers were designed such that the helium gas leaving each bubbler was substantially saturated with the alkyl at the bubbler temperature. The mercury lamp 40 used was in Illumination Industries 3 KW High Pressure Mercury Arc Lamp.

In all examples, the startup sequence of events employed for operating the apparatus illustrate in FIG. 1 was as follows:

1. Orient substrate 20;
2. Close bubbler isolation valves 10, 11, 12, 13, 27, 28;
3. Open bypass valves 8, 9, 26;
4. Adjust helium flowrate through one or more of the flow controllers 3, 4, 23, 5 and 35;
5. Switch on pump 30 and shut exhaust valve;
6. Heat substrate 20 and mercury bath 19 (when used) to the desired temperature;
7. Open the appropriate bubbler isolation valves, and close the corresponding bypass valve or valves;
8. Switch on lamp 40.

The shutdown sequence employed was the reverse of the above sequence.

EXAMPLE 1

Growth of Mercury Telluride layer

In this example, only bubbler 7 was used. Using the above described sequence, the CdTe substrate was first oriented at 2° off (100)→(110). Helium flowrates through flowrate controllers 3, 4, 23, 5, and 35 were adjusted to 0, 1500, 0, 1500 and 2000 cc (cubic centimeters) per minute. The mercury bath 19 was heated to 192° C., and the substrate 20° to 232° C. The results of growing an epitaxial HgTe layer for 1 hour under these conditions are given below:

HgTe layer thickness—1.1 microns
Hall measurements at 77 k:
  Carrier concentration—$9 \times 10^{16}$ cm$^{-3}$
  mobility—55,000 cm$^2$V$^{-1}$s$^{-1}$
Typically impurity levels in HgTe layer as measured by Secondary Ion Mass Spectrometry (SIMS):
Lithium—$4 \times 10^{-2}$ ppma
  Sodium—0.4 ppma
  Aluminium—0.1 ppma
  Potassium—0.2 ppma
  Iron—$5 \times 10^{-2}$ ppm
  (ppma—parts per million atoms)

EXAMPLE 2

Growth of Cadmium Telluride layer

The above described sequence was used to grow an epitaxial CdTe layer employing bubblers 6 and 7 only. The apparatus of FIG. 1 was used, except that the mercury bath 19 was removed from the vessel 16 and the furnance 17 remained switched off. The CdTe substrate was oriented on (110). The helium gas flowrates through controllers 3, 4, 23, 5 and 35 were adjusted to 4.5, 1500, 0, 1500 and 2000 cc per minute respectively. The CdTe substrate was heated to 250° C.

After 1 hour of growth, a 0.2 micron thick epitaxial layer of CdTe was found to have grown on the surface of the substrate 20.

EXAMPLE 3

Grwth of Cadmium Mercury Telluride (CMT) layer

The above described sequence was used to grow an epitaxial layer of CMT employing bubblers 6 and 7 only. The CdTe substrate was oriented on (110). The helium gas flowrates through controllers 3, 4, 23, 5 and 35 were adjusted to 1.4, 1500, 0, 1500 and 2000 cc per minute respectively. The mercury bath 19 was heated to 210° C. and the substrate 20° to 252° C.

After 1 hour of growth, an epitaxial layer of CMT of formula $Cd_{0.24}Hg_{0.76}Cd$ was formed on the surface of the substrate. The layer had a thickness of 1.3 microns and an epitaxial area of 0.6 cm$^2$.

EXAMPLE 4

Growth of CMT layer

The above described sequence was used to grow an epitaxial layer of CMT employing bubblers 6, 7 and 25. The CdTe substrate was oriented at 2° off (100)→(110). Helium gass flowrates through controllers 3, 4, 23, 5 and 35 were adjusted to 3.7, 1500, 375, 1125 and 2000 cc per minute respectively. Bubbler 6 was cooled to 0° C. during use. The CdTe substrate 20 was heated to 228° C., and the mercury bath 19° to 215° C.

After 45 minutes of growth, an apitaxial CMT layer of 0.4 micron thickness and 1.8 cm$^2$ epitaxial surface area was found to have formed. The presence of dimethyl mercury in the vessel 16 was therefore shown to produce a significant increase in yield (i.e. epitaxial surface area).

EXAMPLE 5

Epitaxial Multi Layer Growth

The above described sequence was first used to grow an eptiaxial buffer layer of CdTe employing bubblers 6 and 7 only, with the CdTe substrate oriented on (110). Helium gas flowrates through controllers 3, 4, 23, 5 and 35 were adjusted to 4.5, 1500, 0, 1500 and 2000 cc per minute. The CdTe substrate 20 was heated to 252° C. and the mercury bath 19 maintained at a temperature below 100° C. Growth conditions were maintained for 10 minutes. Without removing the substrate, the conditions were then altered to grow an epitaxial layer of CMT on top of the CdTe buffer layer. The helium flowrate through controller 3 was reduced to 1.4 cc per minute, and the temperature of the mercury bath 19 increased to 210° C. These further growth conditions were maintained for 1 hour, and the resulting epitaxial growth on the substrate 20 was removed for inspection.

The epitaxial growth on the substrate 20 was found to consist of a 1.3 micron thick layer of CMT of formula $Cd_{0.24}Hg_{0.76}Te$ which had grown on a 0.25 micron thick buffer layer of CdTe. The epitaxia area of the growth was 0.6 cm$^2$. The CdTe buffer layer was found to be of good crystalline quality as indicated by measuring the ratio of its helium ion channeling backscatter count to a random direction backscatter count, which was found to be just 8%. The width of the graded composition region at the interface between the CMT and CdTe layers was measured at 300 Angstroms, indicating a sharp transition between the two. This Example also demonstrates that a good quality CdTe layer may be grown even when a small amount of Hg vapour is also present in the furnace atomsphere.

We claim:

1. A method of growing an epitaxial crystalline layer on a semiconductor substrate comprising the steps of:
   providing in the reaction zone of a reaction vessel a heated semiconductor substrate;
   establishing a carrier gas stream, said carrier gas comprising at least 80% by volume of a gas which suppresses homogeneous nucleation of particles in the vapor phase, which carrier gas stream contains, in the vapor phase, at least one alkyl of an element selected from Group Vb and Group VIb of the Periodic Table;
   passing over the surface of the said substrate a carrier gas stream through the reaction zone and in contact with the heated substrate wherein the total gas pressure in the reaction zone is in excess of 0.1 atmospheres; and
   irradiating at least a major part of the surface of the substrate with electromagnetic radiation of wavelength longer than 240 nm to provide photolytic decomposition on the surface of the substrate of the at least one alkyl and consequential epitaxial deposition of the layer containing the said element across at least a major part of the surface of the substrate.

2. A method according to claim 1 wherein the electromagnetic radiation is ultra-violet (UV) radiation.

3. A method according to claim 2 wherein the uv radiation has a wavelength in the general range of 240 to 270 nm.

4. A method according to claim 1 wherein the gas which suppressed homogeneous nucleation of particles in vapor phase is selected from the group consisting of $CH_4$, $C_2H_6$, $N_2$, He, Ne, Ar and mixtures thereof.

5. A method according to claim 4 wherein the gas which suppresses the homogeneous nucleation of particles in vapor phase comprises helium.

6. A method according to claim 1 wherein the carrier gas contains less than 5% by volume of hydrogen.

7. A method according to claim 1 wherein the carrier gas stream is passed over the substrate and the substrate is irradiated from above through the carrier gas stream.

8. A method according to claim 7 wherein a further flow of gas, free of organic reagents, is passed through the reaction zone between the source of electromagnetic radiation and the gas stream and in the same direction as the gas stream.

9. A method according to claim 8 wherein the composition of the further flow of gas is the same as that of the carrier gas.

10. A method according to claim 8 wherein the velocity of the further flow of gas is between 50% and 200% that of the carrier gas stream as the further flow of gas and the carrier gas stream pass the substrate.

11. A method according to claim 1 wherein the thermal decomposition temperature of the at least one Group Vb or Group VIb alkyl is greater than 350° C. in which the temperature of the substrate is 100°–200° C. below this decomposition temperature.

12. A method of growing an epitaxial crystalline layer of a tellurium compound of formula $Cd_xHg_{1-x}Te$ where x is from 0 to 1 onto a semiconductor substrate comprising the steps of:
  providing in the reaction zone of a reaction vessel a heated semiconductor substrate;
  establishing a gas stream, provided by a carrier gas which comprises at least 80% by volume of a gas which suppresses the homogeneous nucleation of particles in the vapor phase said gas stream contains, in the vapor phase, a volatile tellurium alkyl and, when x is greater than 0, a volatile cadium alkyl,
  passing over the surface of the said substrate a gas stream through the reaction zone and in contact with the heated substrate, the total gas pressure in the reaction zone being in excess of 0.1 atmosphere;
  when x is less than 1, providing an atmosphere of mercury at a required temperature and pressure in the reaction zone, and
  irradiating at least a major part of the surface of the substrate with electromagnetic radiation of wavelength greater than 240 nm to provide photolytic decomposition on the surface of the substrate of the alkyl compound or compounds in the region of the substrate and consequential epitaxial deposition of the tellium compound across at least a major part of the surface of the substrate.

13. A method according to claim 12 wherein the electromagnetic radiation is ultra-violet (uv) radiation of a frequency not entirely resonant with the components in the gas stream.

14. A method according to claim 13 wherein the uv radiation has a wavelength in the general range of 240 to 270 nm.

15. A method according to claim 12 wherein the gas which suppresses the homogeneous nculeation of particles in the vapour phase which gas stream is selected from the group consisting of $CH_4$, $C_2H_6$, $N_2$, He, Ne, Ar and mixtures thereof.

16. A method according to claim 15 wherein the gas which suppresses the homogeneous nucleation of particles on the vapour phase which gas stream comprises helium.

17. A method according to claim 12 where the carrier gas contains less than 5% by volume of hydrogen.

18. A method according to claim 12 wherein the carrier gas stream is passed over the substrate and the substrate is irradiated from above through the gas stream.

19. A method according to claim 18 wherein a further flow of gas, free of organic reagents, is passed through the reaction zone between the source of electromagnetic radiation and the gas stream and in the carrier same direction as the gas stream.

20. A method according to claim 19 wherein the composition of the further flow of gas is the same as that of the carrier gas.

21. A method according to claim 19 wherein the velocity of the further flow of gas is between 50% and 200% that of the gas stream as the further flow of gas and the gas stream pass the substrate.

22. A method according to claim 12 wherein the partial pressure of the mercury atmosphere is greater than $10^{-2}$ atmospheres when x is less than 1.

23. A method according to claim 12 wherein x is greater than 0.

24. A method according to claim 23 wherein the volumetric ratio of carrier gas to cadmium alkyl in the gas stream is greater than $10^4:1$.

25. A method according to claim 12 wherein the substrate is heated to a temperature of from 200° C. to 270° C.

26. A method of growing an epitaxial crystalline layer of a tellurium compound of formula $Cd_xHG_{1-x}Te$ where x is from 0 to 1 onto a substrate comprising the carrier steps of
  (a) providing in the reaction zone of a reaction vessel a heated substrate,
  (b) establishign a gas stream, provided by a carrier gas which comprises at least 50% by volume of a gas which suppresses the homogeneous nucleation of particles in the vapor phase, which gas stream contains, in the vapor phase, a volatile tellurium alkyl and, when x is greater than 0, a volatile cadium alkyl, and wherein the gas stream contains an additional photolytically unstable alkyl compound whose products of decomposition do not contaminate the growing epitaxial layer,
  (c) passing the gas stream through the reaction zone in contact with the heated substrate,
  (d) when x is less than 1, providing an atmosphere of mercury at a required temperature and pressure in the reaction zone, and
  (e) irradiating at least a major part of the surface of the substrate with electromagnetic radiation to provide photolytic decomposition of the alkyl compound or compounds in the region of the substrate and consequential epitaxial deposition of the tellurium compound across at least a major part of the surface of the substrate.

27. A method according to claim 26 wherein the additional alkyl compound comprises a mercury alkyl.

28. A method accordikng to claim 26 wherein the additional alkyl compound comprises an azoalkane.

29. A method of growing an epitaxial layer of the ternary alloy $Cd_xHg_{1-x}Te$ onto a heated substrate comprises the steps of:
  providing an atmosphere of mercury vapor at a required temperature and pressure inside a vessel;
  controlling the temperature of the substrate independently of the vessel temperature;
  providing separate supplies of a cadmium alkyl, a tellurium alkyl, and a dilutant gas into the vessel to grow a layer of Hgte $t_1$ thick and a layer of CdTe $t_2$ thick in either order;
  switching the supply of cadmium alkyl to the substrate on and off to grwow a layer of CdTe and of HgTe, the combined thickness $t_1+t_2$ of the two layers being not greater than 0.5 $\mu$m thick, the arrangement being such that the Cd alkyl decomposes preferentially with the Te alkyl in the region of the substrate to form CdTe as a layer on the substrate, the Te alkyl combines with the Hg vapor to form a HgTe layer on the substrate, the thickness of both allowing diffusion during growth to give a layer of $Cd_xHg_{1-x}Te$ where $0<x<1$, wherein the cadmium and tellurium alkyls are each supplied to the vessel in the vapor phase within a carrier gas comprising at least 50% by volume of the gas which suppresses the homogeneous nucleation of particles in the vapor phase, the total gas pressure in the region of the substrate being in excess of 0.1 atmospheres, and further wherein at least a major part of the surface of the substrate is irradiated with electromagnetic radiation during the growth of the CdTe and HgTe layers.

* * * * *